(12) United States Patent
Clark

(10) Patent No.: US 9,170,290 B1
(45) Date of Patent: Oct. 27, 2015

(54) METHOD FOR ASYNCHRONOUS IMPULSE RESPONSE MEASUREMENT BETWEEN SEPARATELY CLOCKED SYSTEMS

(71) Applicant: Jeffrey Clark, Alhambra, CA (US)

(72) Inventor: Jeffrey Clark, Alhambra, CA (US)

(73) Assignee: AUDYSSEY LABORATORIES, INC., Los Angeles, CA (US)

( * ) Notice: Subject to any disclaimer, the term of this patent is extended or adjusted under 35 U.S.C. 154(b) by 252 days.

(21) Appl. No.: 13/974,782

(22) Filed: Aug. 23, 2013

(51) Int. Cl.
*G01R 29/26* (2006.01)
*G01R 31/26* (2014.01)
*G01R 31/317* (2006.01)
*G01R 33/00* (2006.01)

(52) U.S. Cl.
CPC ............ *G01R 29/26* (2013.01); *G01R 31/2616* (2013.01); *G01R 31/2626* (2013.01); *G01R 31/2646* (2013.01); *G01R 31/31709* (2013.01); *G01R 33/0029* (2013.01)

(58) Field of Classification Search
CPC .... G01R 23/20; G01R 29/26; G01R 31/2616; G01R 31/2626; G01R 31/2646; G01R 31/31708; G01R 31/31709; G01R 33/0029
USPC ........... 324/600, 612, 613, 614, 76.11, 76.12, 324/76.13, 76.15, 76.38
See application file for complete search history.

(56) References Cited

U.S. PATENT DOCUMENTS

| | | | |
|---|---|---|---|
| 4,791,356 A | 12/1988 | Warren et al. | |
| 5,309,484 A | 5/1994 | McLane et al. | |
| 5,535,252 A | 7/1996 | Kobayashi | |
| 5,589,763 A | 12/1996 | Burns | |
| 6,243,841 B1 | 6/2001 | Mydill | |
| 6,448,782 B1 * | 9/2002 | Pakonen et al. | 324/536 |
| 6,606,583 B1 | 8/2003 | Sternberg et al. | |
| 6,724,849 B1 * | 4/2004 | Long et al. | 375/371 |
| 7,281,077 B2 * | 10/2007 | Woodral | 710/310 |
| 8,253,675 B2 * | 8/2012 | Kim et al. | 345/94 |
| 2005/0039079 A1 | 2/2005 | Higashi et al. | |
| 2005/0117667 A1 * | 6/2005 | Yajima et al. | 375/324 |
| 2006/0149492 A1 | 7/2006 | Guidry | |
| 2007/0265989 A1 * | 11/2007 | Kampert et al. | 705/401 |
| 2008/0001798 A1 | 1/2008 | Moll et al. | |
| 2011/0057665 A1 | 3/2011 | Watanabe et al. | |
| 2014/0102219 A1 * | 4/2014 | Kuwahara et al. | 73/862.333 |

* cited by examiner

*Primary Examiner* — Hoai-An D Nguyen
(74) *Attorney, Agent, or Firm* — Kenneth L. Green; Averill & Green

(57) ABSTRACT

A method for measuring acoustic impulse response of a Device Under Test (DUT) addresses sample rate variations by determining clock rate differences between the DUT and test system, and making adjustments to compensate for the different clock rates. An interrogation signal is generated with two "events" spaced a known number of samples apart, at the nominal sampling rate of the DUT. The interrogation signal is played through the DUT and recorded by a measurement system. The number of samples between the two "events" is measured in the sampled signal to determine the shift introduced by the different clock rates. The adjustment is then applied to either the original frequency response measurement signal by adjusting the sampling rate of a frequency response measurement signal to compensate for the different clock rates, or to the measured signal before averaging, to align the samples and prevent cancelling.

18 Claims, 4 Drawing Sheets

METHOD FOR ASYNCHRONOUS IMPULSE RESPONSE MEASUREMENT BETWEEN SEPARATELY CLOCKED SYSTEMS

BACKGROUND OF THE INVENTION

The present invention relates measuring the impulse response of a system, and in particular, reducing errors when averaging multiple repetitions to smooth the impulse response measurement of phone systems.

Known methods have difficulty in measuring the frequency response of a Device Under Test (DUT), for example a phone, clocked separately from a measurement system. Although the clocks of the phone and the measuring device may vary by as little as 0.001%, methods averaging multiple measurements for noise reduction may fail. For example, when measuring the frequency response of a DUT that is playing back at 48 kHz, with a test system that is recording at 48 kHz, the two sampling rates will differ from each other by a very small amount, due to the relative precision of their individual oscillators. When measuring acoustic signals, averaging multiple repetitions of a frequency response measurement signal is performed in the digital domain to reduce the measured and uncorrelated noise. When the sampling rates differ even slightly, each repetition of the frequency response measurement signal becomes more and more out of phase with the DUT signal, until cancellation and comb filtering arise.

Measurements might be performed using a single measurement iteration, but no noise reduction would result.

BRIEF SUMMARY OF THE INVENTION

The present invention addresses the above and other needs by providing a method for measuring an acoustic impulse response of a Device Under Test (DUT) which addresses sample rate variations by determining clock rate differences between the DUT and test system, and making adjustments to compensate for the different clock rates. An interrogation signal is generated with two "events" spaced a known number of samples apart, at the nominal sampling rate of the DUT. The interrogation signal is played through the DUT and recorded by a measurement system. The number of samples between the two "events" is measured in the sampled signal to determine a shift introduced by the different clock rates. The adjustment is then applied to either the original frequency response measurement signal by adjusting the sampling rate of a frequency response measurement signal to compensate for the different clock rates, or to the measured signal before averaging, to align the samples and prevent cancelling.

In accordance with one aspect of the invention, there is provided a method for measuring a clock difference between two independently clocked devices. The method includes generating a interrogation signal with two "events" spaced a known number of samples apart, playing the interrogation signal on a Device Under Test (DUT) and recording by the measurement system, measuring the number of samples between the two "events" in the interrogation signal in the recorded signal, and determining a number of samples shift between the generated interrogation signal and the measured interrogation signal.

In accordance with another aspect of the invention, there is provided a method for correcting a clock rate difference between two independently clocked devices. The method includes mathematically adjusting the sampling rate of a frequency response measurement signal and playing the adjusted frequency response measurement signal through the DUT, recording the DUT output in the measurement system, and integrating the recorded signal to reduce noise.

In accordance with still another aspect of the invention, there is provided a method for correcting a clock rate difference between two independently clocked devices. The method includes generating an interrogation signal with two events spaced an original number of samples apart, playing the interrogation signal on a Device Under Test (DUT) and recording the interrogation signal with a measurement system, automatically or manually measuring the number of samples between the two events in the recorded interrogation signal, determining a clock rate difference between the DUT and the measurement system by comparing the measured number of samples to the original number of samples, generating a modified discrete time digital frequency response measurement signal, including repetitions of a stimulus wave form, based on a sample rate adjusted by the clock rate difference, playing the modified discrete time digital frequency response measurement signal through the DUT, recording the DUT output in the measurement system, and integrating the recorded signal with the repetitions of the stimulus wave form overlapped to reduce noise.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
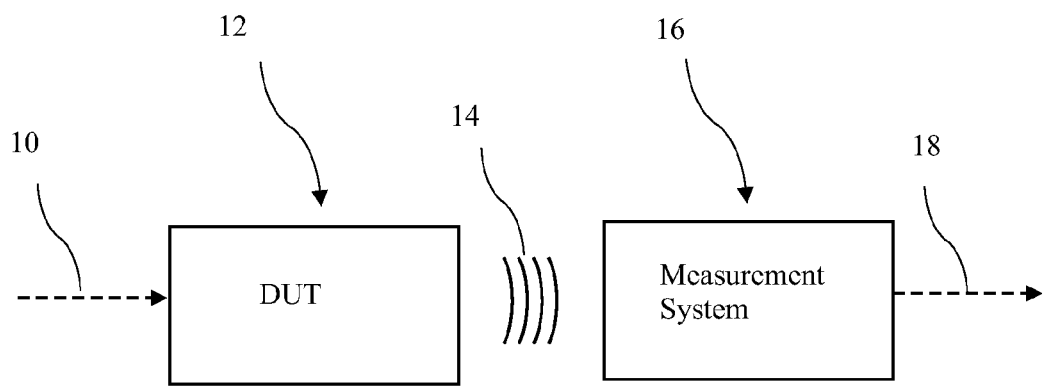
FIG. 1 shows a test setup for measuring the impulse response of a Device Under Test (DUT) 12.

A test setup for measuring the impulse response of a Device Under Test (DUT) 12 is shown in FIG. 1. Repetitions of a frequency response measurement (or stimulus) signal 10 are provided to the DUT 12. The DUT 12 generates acoustic signals 14 received by a measurement system 16, and the measurement system integrates the acoustic signals 14 to provide a smoothed output 18.

Figure 2:
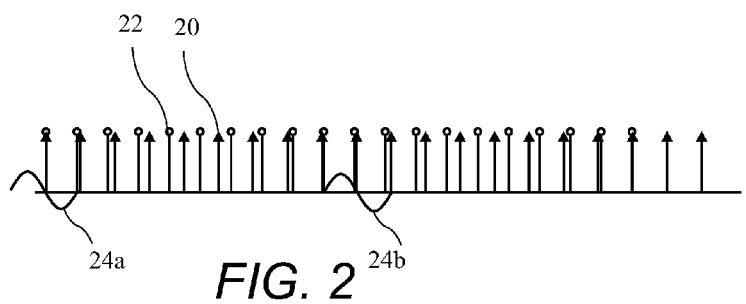
FIG. 2 shows a sample rate of a DUT and a measurement system, and a general signal and a repetition of the general signal, according to the present invention.
Figure 3:
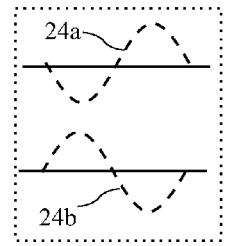
FIG. 3 shows the general signal and the repetition of the general signal 180 degrees out of phase, according to the present invention.

Samples 20 of a Device Under Test (DUT) and samples 22 of a measurement system, and a general signal 24a and a repetition of the general signal 24b are shown in FIG. 2, and the general signal 24a and the repetition of the general signal 24b are shown 180 degrees out of phase in FIG. 3. When measuring signal generated by a system that is playing back at 48 kHz, with a measurement system that is recording at 48 kHz, the two sampling rates will differ from each other by a very small amount, due to the relative precision of their individual oscillators. When measuring acoustic signals, averaging multiple repetitions of a frequency response measurement signal is performed in the digital domain to reduce the measured and uncorrelated noise. When the sampling rates differ slightly, each repetition of the frequency response measurement signal becomes more and more out of phase with the initial signal, until cancellation and comb filtering arise. The signals seen in FIG. 2 are 180 degrees out of phase and will average to zero.

Figure 4:
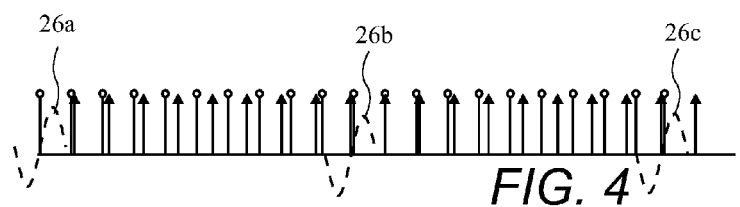
FIG. 4 shows a two event interrogation signal played through the DUT and recorded by the measurement system, according to the present invention.

An interrogation signal played through the DUT and recorded by the measurement system, having two events 26a and 26b, is shown in FIG. 4. The two events 26a and 26b are spaced a known number of samples apart, at the nominal sampling rate of the DUT. The events are spaced sufficiently so as to ensure adequate accuracy. The spacing determined by the time that will be spanned by the final measurement signal repetitions. For example, if the measurement signal is 250 ms in length, and will be repeated eight times, the total span will be two seconds. In order to ensure accuracy to within one sample over this time period, the sampling rate interrogation signal is preferably at least twice as long. In FIG. 4 the second event 26b is in the tenth sample of the DUT, but in the eleventh sample of the measurement system.

By comparing where the second event 26b is detected in the measurement system, the clock rate difference between the DUT and the measurement system is accurately measured. The clock rate difference can be determined by automatically or manually measure the number of samples between the two events 26a and 26b in the recorded interrogation signal. The number of samples vs. the expected number of samples establishes the relative sampling rate of the DUT 12 vs. the measurement system 16.

Figure 5:
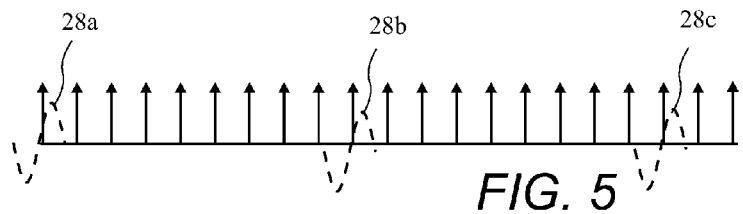
FIG. 5 shows a measurement signal played through the DUT, according to the present invention.
Figure 6:
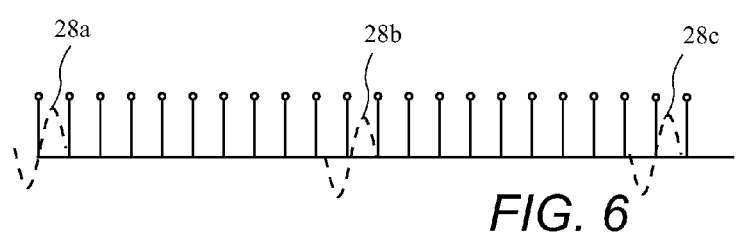
FIG. 6 shows the measurement signal recorded on the measurement system, according to the present invention.
Figure 7:
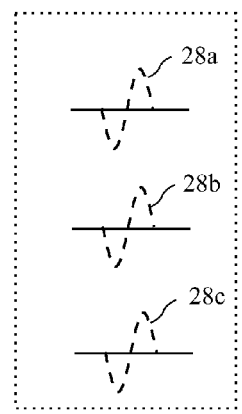
FIG. 7 shows consecutive repetitions of the measurement signal aligned in phase, according to the present invention.

A frequency response measurement signal 28a, and repetitions 28b and 28c, played through the DUT are shown in FIG. 5, frequency response measurement signals 28a, 28b, and 28c recorded by the measurement system 16 is shown in FIG. 6, and the aligned for integration frequency response measurement signals 28a, 28b, and 28c are shown in FIG. 7. The frequency response measurement signals 28a, 28b, and 28c are shifted in the DUT 12 based on the clock rate difference, and as a result are correctly spaced and integrated by the measurement system 16.

For example, repetitions of the frequency response measurement signal may be generated at the DUT relative sampling rate. If a sequence such as a swept sine, logarithmically swept sine is used, the phasing of the end sample of one sequence and the starting sample of the next sequence must be taken into account by shifting the first sample of the next sequence by the appropriate amount. This is done because each sequence will likely not be a whole number of samples in length at the DUT relative sampling rate. Samples in the frequency response measurement signal where the frequency would exceed the target device's Nyquist rate should be set to zero. This must be achieved in the mathematical generation or aliasing will occur.

Because the clock rate difference has been accounted for, the recording on the measurement system will contain the repeating test signal sequences, such that they are each a whole number of samples. Although they may not start/end on exact sample boundaries, this is ok, as they will always start/end on the same relative offset from a sample boundary.

An alternative to generating the signal at the DUT relative sampling rate is to resample a version of the signal at the nominal sampling rate to the DUT relative sampling rate. Those skilled in the art will recognize that this can be done any number of ways, but is likely not to be as accurate as mathematically generating the signal, and these other methods are intended to come within the scope of the present invention.

Figure 8:
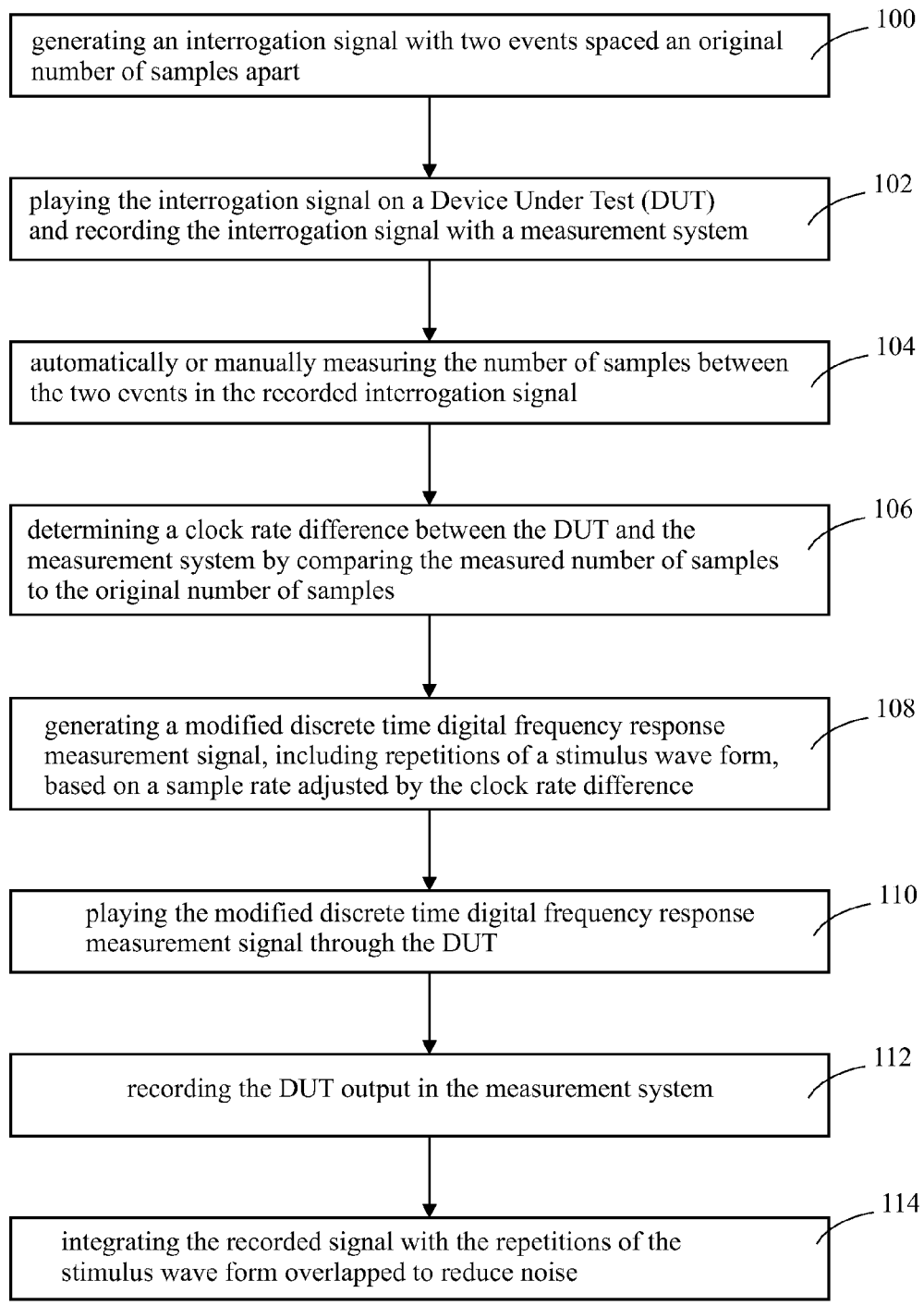
FIG. 8 is a first method, according to the present invention.

A first method according to the present invention is shown in FIG. 8. The method includes generating an interrogation signal with two events spaced an original number of samples apart at step 100, playing the interrogation signal on a Device Under Test (DUT) and recording the interrogation signal with a measurement system at step 102, automatically or manually measuring the number of samples between the two events in the recorded interrogation signal at step 104, determining a clock rate difference between the DUT and the measurement system by comparing the measured number of samples to the original number of samples at step 106, generating a modified discrete time digital frequency response measurement signal, including repetitions of a stimulus wave form, based on a sample rate adjusted by the clock rate difference at step 108, playing the modified discrete time digital frequency response measurement signal through the DUT at step 110, recording the DUT output in the measurement system at step 112, and integrating the recorded signal with the repetitions of the stimulus wave form overlapped to reduce noise at step 114.

For example, if the measurement signal is a chirp computed at discrete times correspond to the DUT clock rate, we adjust the discrete times from the DUT clock rate to account for the clock difference between the DUT clock and the measurement system clock. For example, rather than computing samples of the measurement signal function at exactly 48,000 Hz for an advertised DUT clock rate of 48,000 Hz, we might sample the chirp it at 48,001 Hz to account for the relative difference in the sampling rates of the DUT(48,001 Hz) vs. that of the testing device (which is taken as our 48,000 reference). The measurement signal repeats the chirp, but just computing one iteration of the chirp at 48,001 Hz, and constructing the measurement signal by repeating the one iteration is not correct because the signal repetitions won't necessarily start/end on whole-sample number boundaries. Instead, the chirp periodically repeats over the length of the measurement signal using the (e.g.) 48001 Hz sampling rate. Further, the frequencies present in the chirp function may exceed the Nyquist frequency when the sampling rate of the DUT is below that of the reference device (e.g. 47900 Hz) and are preferably taken into account.

For an actual DUT clock rate determined to be 47,990 HZ (versus an ideal clock rate of 48,000 Hz) with a resulting sample period T of 0.000020838 seconds versus 0.000020833 for 48,000 Hz, a continuous stimulation signal is evaluated at times 1T, 2T, 3T, . . . to create a measurement signal file to correct for the DUT clock rate error. The measurement signal file may be a WAV file.

In some instances, the ideal measurement signal may include frequencies exceeding the Nyquist rate of the DUT. In the case of a chirp signal with known instantaneous frequency, the chirp may be computed only up to the Nyquist rate of the DUT. For other measurement signals, resampling may be required. In the case of most functions, the instantaneous frequency can be calculated to avoid exceeding the Nyquist frequency of the DUT.

Figure 9:
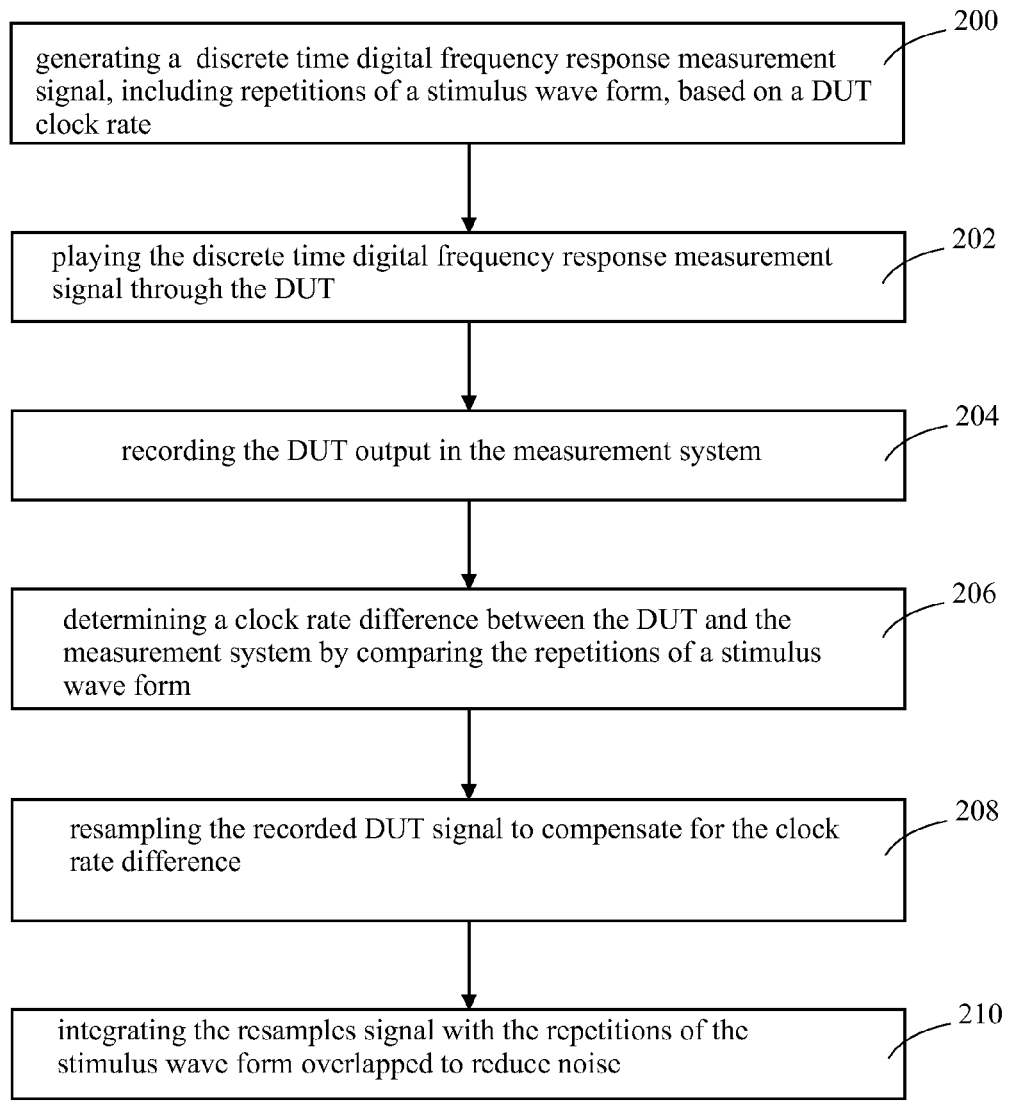
FIG. 9 is a second method, according to the present invention.

A second method according to the present invention is shown in FIG. 9. The second method includes generating a discrete time digital frequency response measurement signal, including repetitions of a stimulus wave form, based on a DUT clock rate at step 200, playing the discrete time digital frequency response measurement signal through the DUT at step 202, recording the DUT output in the measurement system at step 204, determining a clock rate difference between the DUT and the measurement system by comparing the repetitions of a stimulus wave form at step 206, resampling the recorded DUT signal to compensate for the clock rate difference at step 208, and integrating the resamples signal with the repetitions of the stimulus wave form overlapped to reduce noise at step 210. Determining a clock rate difference may comprise performing an auto correlation or other methods.

Another method for correcting the difference in clock times includes generating a frequency response measurement signal at the advertised clock rate of the DUT, adjusting the clock rate of the measurement system to match the clock rate of the DUT, playing the frequency response measurement signal through the DUT, recording the DUT output in the adjusted clock rate measurement system, and integrating the recorded signal with the repetitions of the stimulus wave form overlapped to reduce noise.

Still another method for correcting the difference in clock times includes generating repetitions of a measurement signal at the advertised DUT clock rate, playing the measurement signal through the DUT, recording the DUT output by the measurement system, and resampling the recorded DUT output based on the difference in clock rates to align consecutive to compensate for the difference in clock rates.

The method of the present invention may be applied to impulse response measurements by deconvolution of the recorded signal by the measurement signal, or to other measurements. A direct frequency response may be measured as well.

The present invention may further apply to electrical measurements. Although noise is usually less of a concern with electrical measurements, because measurements are asynchronous, and the measurement signal is repeated continuously, and a rectangular window is sampled by the measuring device, a shift in playback rate results in a recorded window which is not exactly the length of one repetition of the measurement signal. This miss-match causes undesirable artifacts in the frequency response.

While the invention herein disclosed has been described by means of specific embodiments and applications thereof, numerous modifications and variations could be made thereto by those skilled in the art without departing from the scope of the invention set forth in the claims.

I claim:

1. A method for avoiding cancelling in asynchronous measurement integration when a measurement system and a Device Under Test (DUT) have different clock rates, the method comprising:
   generating a measurement data signal;
   providing the measurement data signal to the DUT;
   broadcasting the measurement data signal by the DUT;
   recording the broadcasted measurement data signal;
   integrating the recorded broadcasted measurement data signal to reduce noise; and
   before integrating the recorded broadcasted measurement data signal:
   determining a difference in clock rates between the DUT and the measurement system; and
   compensating for the difference in clock rates to avoid cancelling elements of the measurement data signal.

2. The method of claim 1, wherein determining a difference in clock rates between the DUT and measurement system comprises:
   generating a measurement data signal:
   generating a interrogation signal with two events spaced an original number of samples apart;
   playing the interrogation signal on a DUT and recording interrogation signal with the measurement system;
   measuring the number of samples between the two "events" in the interrogation signal; and
   determining a clock rate between the generated interrogation signal and the measured interrogation signal by comparing the measured number of samples to the original number of samples between the two events.

3. The method of claim 2, wherein the events in the interrogation signal are spaced apart by at least twice a total length of the measurement data signal.

4. The method of claim 1, wherein determining a difference in clock rates between the DUT and the measurement system is performed before generating a measurement data signal, the method further comprising:
   generating a measurement data signal at a clock rate adjusted according to the difference in clock rates; and
   broadcasting the adjusted measurement data signal through the DUT.

5. The method of claim 4, wherein the measurement data signal is a frequency response measurement data signal.

6. The method of claim 4, wherein the measurement data signal is a chirp.

7. The method of claim 2, wherein generating a measurement data signal comprises generating a measurement data signal at the advertised clock rate of the DUT, and compensating for the difference in clock rates to avoid cancelling elements of the measurement data signal:
   adjusting the clock rate of the measurement system to match the clock rate of the DUT;
   playing the measurement data signal through the DUT; and
   recording the DUT output in the adjusted clock rate measurement system.

8. The method of claim 7, wherein the measurement data signal is a frequency response measurement data signal.

9. The method of claim 7, wherein the measurement data signal is a chirp.

10. The method of claim 1, wherein compensating for the difference in clock rates to avoid cancelling elements of the measurement data signal comprises obtaining measurement data compensated for the measured shift comprising:
    generating repetitions of a measurement data signal at the DUT clock rate;
    playing the measurement data signal through the DUT;
    recording the DUT output by the measurement system;
    determining a clock rate difference between the DUT and the measurement system by comparing the repetitions of a stimulus wave form; and
    resampling the recorded DUT output based on the difference in clock rates to align consecutive.

11. The method of claim 10, wherein the measurement data signal is a frequency response measurement data signal.

12. The method of claim 10, wherein the measurement data signal is a chirp.

13. The method of claim 10, wherein comparing the repetitions of a stimulus wave form includes performing an auto-correlation on the repetitions of a stimulus wave form.

14. The method of claim 1, wherein compensating for the difference in clock rates to avoid cancelling elements of the measurement data signal comprises obtaining measurement data compensated for the measured shift comprising:
  generating repetitions of a measurement data signal at the DUT clock rate;
  playing the measurement data signal through the DUT;
  recording the DUT output by the measurement system; and
  resampling the recorded DUT output based on the difference in clock rates to align consecutive measurement signal repetitions.

15. The method of claim 14, wherein the measurement data signal is a frequency response measurement data signal.

16. The method of claim 14, wherein the measurement data signal is a chirp.

17. A method for avoiding cancelling in asynchronous impulse response measurement integration, the method comprising:
  generating an interrogation signal with two events spaced an original number of samples apart corresponding to at least twice a total length of a frequency response measurement data signal;
  playing the interrogation signal on a Device Under Test (DUT) and recording the interrogation signal with a measurement system;
  measuring the number of samples between the two events in the recorded interrogation signal;
  determining a clock rate difference between the DUT and the measurement system by comparing the measured number of samples to the original number of samples;
  generating a modified discrete time digital frequency response measurement data signal, including repetitions of a stimulus wave form, based on a sample rate adjusted by the clock rate difference;
  playing the modified discrete time digital frequency response measurement data signal through the DUT;
  recording the DUT output in the measurement system; and
  integrating the recorded signal with the repetitions of the stimulus wave form overlapped to reduce noise.

18. A method for avoiding cancelling in asynchronous impulse response measurement integration, the method comprising:
  generating an interrogation signal with two events spaced an original number of samples apart;
  playing the interrogation signal on a Device Under Test (DUT) and recording the interrogation signal with a measurement system;
  measuring the number of samples between the two events in the recorded interrogation signal;
  determining a clock rate difference between the DUT clock rate and the measurement system clock rate by comparing the measured number of samples to the original number of samples;
  generating a discrete time digital frequency response measurement data signal, including repetitions of a stimulus wave form, based on the DUT clock rate;
  adjusting the measurement system clock rate based on the measured clock rate difference;
  playing the discrete time digital frequency response measurement data signal through the DUT;
  recording the DUT output in the measurement system; and
  integrating the recorded signal with the repetitions of the stimulus wave form overlapped to reduce noise.

\* \* \* \* \*